(12) United States Patent
Tsuchiya et al.

(10) Patent No.: US 10,955,709 B2
(45) Date of Patent: Mar. 23, 2021

(54) DISPLAY DEVICE

(71) Applicants: Sharp Kabushiki Kaisha, Sakai (JP); Sakai Display Products Corporation, Sakai (JP)

(72) Inventors: Hiroshi Tsuchiya, Sakai (JP); Kiyoshi Minoura, Sakai (JP); Shinji Shimada, Sakai (JP); Yuhki Kobayashi, Sakai (JP); Yozo Narutaki, Sakai (JP)

(73) Assignees: SHARP KABUSHIKI KAISHA, Sakai (JP); SAKAI DISPLAY PRODUCTS CORPORATION, Sakai (JP)

( * ) Notice: Subject to any disclaimer, the term of this patent is extended or adjusted under 35 U.S.C. 154(b) by 0 days.

(21) Appl. No.: 16/649,693

(22) PCT Filed: Sep. 29, 2017

(86) PCT No.: PCT/JP2017/035711
§ 371 (c)(1),
(2) Date: Mar. 23, 2020

(87) PCT Pub. No.: WO2019/064578
PCT Pub. Date: Apr. 4, 2019

(65) Prior Publication Data
US 2020/0257173 A1    Aug. 13, 2020

(51) Int. Cl.
G02F 1/1343    (2006.01)
G02F 1/1337    (2006.01)
G02F 1/1339    (2006.01)

(52) U.S. Cl.
CPC ...... *G02F 1/134309* (2013.01); *G02F 1/1337* (2013.01); *G02F 1/1339* (2013.01); *G02F 2201/07* (2013.01); *G02F 2201/123* (2013.01); *G02F 2203/02* (2013.01)

(58) Field of Classification Search
None
See application file for complete search history.

(56) References Cited

U.S. PATENT DOCUMENTS

| 2003/0062828 A1 | 4/2003 | Sugimoto et al. |
| 2003/0193457 A1 | 10/2003 | Wang et al. |
| 2006/0072047 A1 | 4/2006 | Sekiguchi |

FOREIGN PATENT DOCUMENTS

| JP | 2002-196702 A | 7/2002 |
| JP | 2002-343580 A | 11/2002 |
| JP | 2003-316295 A | 11/2003 |
| JP | 2010-027504 A | 2/2010 |
| WO | 2004/053819 A1 | 6/2004 |

OTHER PUBLICATIONS

Official Communication issued in International Patent Application No. PCT/JP2017/035711, dated Jan. 9, 2018.

*Primary Examiner* — James A Dudek
(74) *Attorney, Agent, or Firm* — Keating & Bennett, LLP

(57) ABSTRACT

A display device includes a first substrate including a light-emitting element that is an upward light emission type and a transistor in a lower layer than the light-emitting element, a second substrate facing the first substrate, and a liquid crystal layer disposed between the first substrate and the second substrate. The first substrate includes a sealing film formed in an island shape and covering the light-emitting element and a pixel electrode that is transparent. The pixel electrode includes a first portion not overlapping the sealing film and a second portion overlapping the sealing film.

20 Claims, 7 Drawing Sheets

DISPLAY DEVICE

TECHNICAL FIELD

The disclosure relates to a display device.

BACKGROUND ART

PTL 1 discloses a display device for performing light emission display by an EL light-emitting element and liquid crystal display by a reflective liquid crystal element.

CITATION LIST

Patent Literature

PTL 1: WO 2004/053819 (published on Jun. 24, 2004)

SUMMARY

Technical Problem

In a known display device, a light-emitting region is the same for both light emission display and reflective liquid crystal display, and this causes a problem that the luminance is insufficient when performing the reflective liquid crystal display. In addition, a contact hole connecting a pixel electrode and a switching element is formed in an insulating layer that protects the light-emitting element from moisture and oxygen, and this causes a problem that reliability cannot be ensured.

Solution to Problem

A display device according to an aspect of the disclosure includes a first substrate including a light-emitting element that is an upward light emission type and a transistor in a lower layer than the light-emitting element, a second substrate facing the first substrate, and a liquid crystal layer disposed between the first substrate and the second substrate. The first substrate includes a sealing film formed in an island shape and covering the light-emitting element and a pixel electrode that is transparent, and the pixel electrode includes a first portion not overlapping the sealing film and a second portion overlapping the sealing film.

Advantageous Effects of Disclosure

The use of the first portion and the second portion for a reflective liquid crystal element allows the luminance when performing the reflective liquid crystal display to be increased. The first portion not overlapping the sealing film is connected to a contact hole, and the reliability of the light-emitting element can be secured, for example.

DESCRIPTION OF EMBODIMENTS

First Embodiment

In the following description, "the same layer" refers to a layer formed of the same material through the same process, "a lower layer" refers to a layer formed in a process before a process in which a layer to be compared is formed, and "an upper layer" refers to a layer formed in a process after the process in which the layer to be compared is formed. Also, "overlapping" refers to a case that two members include an overlapping portion in a plan view and includes a case that another member is interposed between the two members and a case that another member is not interposed therebetween.

FIG. 1(a) is a plan view illustrating a display device according to the first embodiment, and FIG. 1(b) is a circuit diagram illustrating a configuration example of a subpixel. As illustrated in FIG. 1(a), a display device 3 according to the first embodiment includes a display portion 3d including a red subpixel SP(R), a green subpixel SP(G), and a blue subpixel SP(B), a driver circuit DRC configured to drive the display portion 3d, an external light sensor LS, and a display control circuit DCC.

Figure 1:
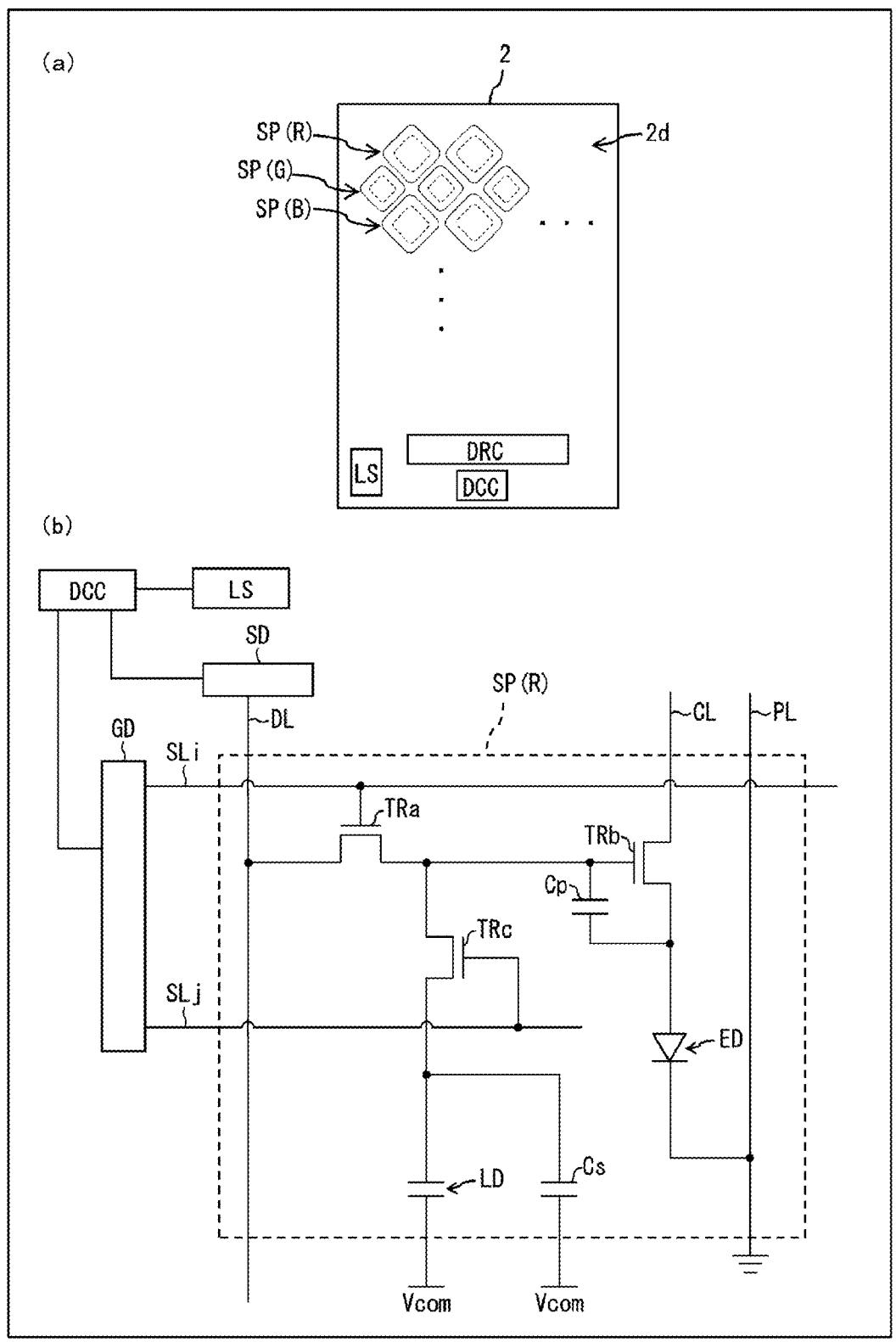
FIG. 1(a) is a plan view illustrating a display device according to a first embodiment.
FIG. 1(b) is a circuit diagram illustrating a configuration example of a subpixel.

As illustrated in FIG. 1, the display portion 3d is provided with a data line DL, a gate line GLn, a switching line KL, a current line CL, and a ground line PL. The driver circuit DRC includes a source driver SD configured to drive the data line DL and a gate driver GD configured to drive the gate line GLn and the switching line KL. The display control circuit DCC controls the source driver SD and the gate driver GD on the basis of output (an external light amount) of the external light sensor LS.

The subpixel SP includes a light-emitting element ED (for example, an organic light-emitting diode), a reflective liquid crystal element (a reflective liquid crystal capacitance) LD, transistors TRx, TRy, TRz, and capacitances Cp, Cs. For example, the red subpixel SP(R) includes the reflective liquid crystal element LD including a red color filter and the light-emitting element ED configured to emit red light.

In a period of time at which the switching line KL is inactive (the external light amount is less than a threshold), the transistor TRy is off, and in a case that the gate line GLn is activated, a gray scale signal for light emission display is input via the data line DL and the transistor TRx, and the capacitance Cp is charged in accordance with the gray scale. Then, in a case that the current line CL is activated, the current flows to the light-emitting element ED via the transistor TRz, and the light-emitting element ED emits light at a luminance corresponding to the gray scale. A cathode of the light-emitting element ED is connected to the ground line PL.

In a period of time at which the switching line KL is active (the external light amount is equal to or greater than the threshold), the transistor TRy is on, and in a case that the gate line GLn is activated, a gray scale signal for reflective liquid crystal display is input via the data line DL, the transistor TRx, and the transistor TRy, and the reflective liquid crystal element (a reflective liquid crystal capacitance) LD is charged in accordance with the gray scale. This provides the reflective liquid crystal element LD with a transmittance corresponding to the gray scale, and reflected light passes through the reflective liquid crystal element LD. The capacitance Cs functions as an auxiliary capacitance of the reflective liquid crystal element LD.

Figure 2:
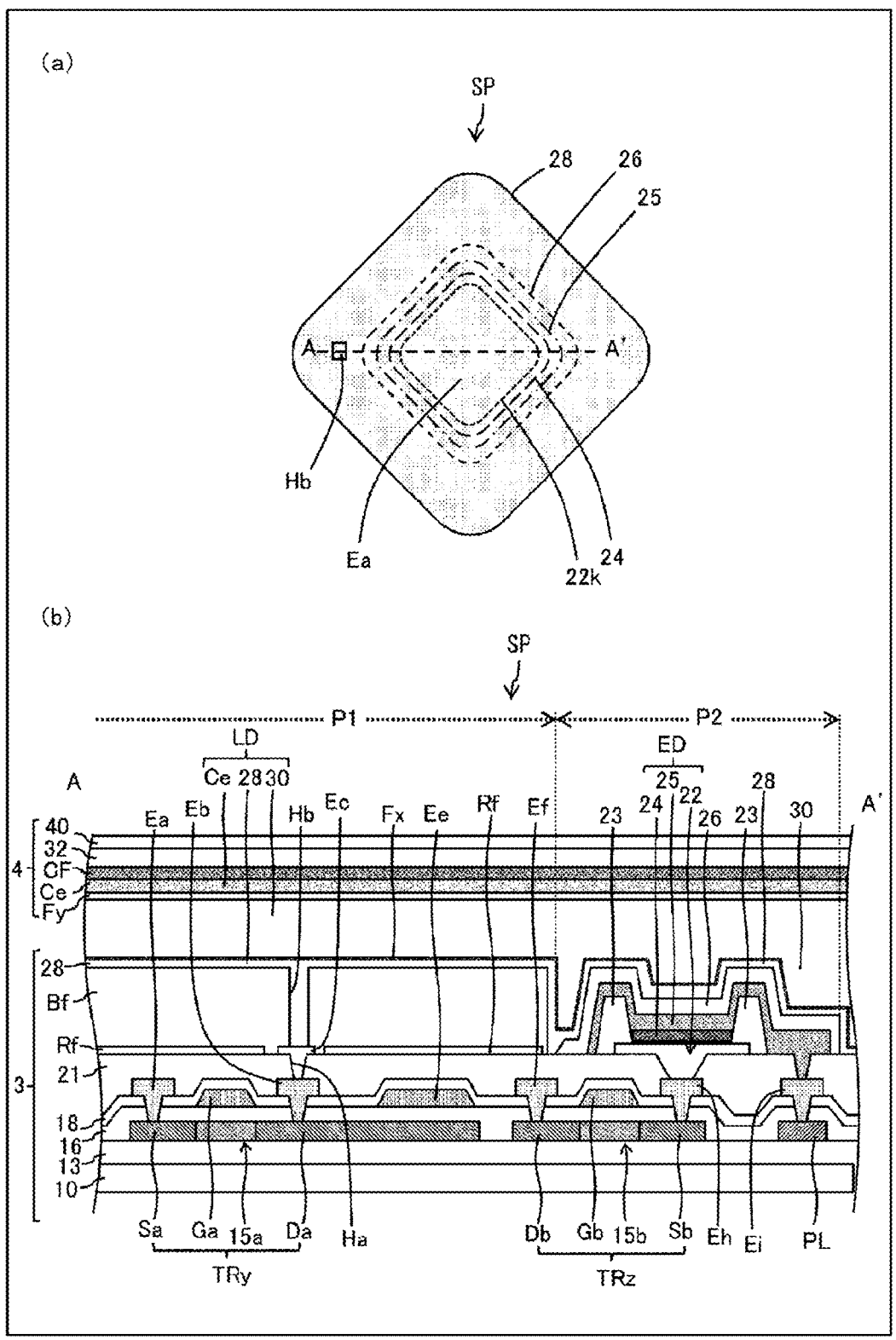
FIG. 2(a) is a plan view illustrating a configuration example of a subpixel.
FIG. 2(b) is a cross-sectional view passing through the subpixel of a display portion.

FIG. 2(a) is a plan view illustrating a configuration example of a subpixel, and FIG. 2(b) is a cross-sectional view passing through the subpixel of the display device. As illustrated in FIG. 2, in the display device 3, a first substrate (a lower substrate) 1, a liquid crystal layer 30, a second substrate (an upper substrate) 2, and a circular polarizer 40 are layered in this order.

In the first substrate 1, a barrier layer 13; semiconductor films 15a, 15b; an inorganic insulating film 16; electrodes Ga, Ee, Gb; an inorganic insulating film 18; electrodes Ea, Eb, Ef, Eh, Ei; an interlayer insulating film 21; a light reflective film Rf, an electrode Ec, and an anode 22; a buffer film Bf and an electrode cover film 23; a light-emitting layer 24; a cathode 25; a sealing film 26; a pixel electrode 28; and an alignment film Fx are layered on a base material 10 in this order. In the second substrate 2, a color filter CF, a counter electrode Ce, and an alignment film Fy are layered on a base material 32 in this order.

The subpixel SP is provided with the light-emitting element ED and the reflective liquid crystal element LD. The light-emitting element ED includes the anode 22 (a lower electrode), the light-emitting layer 24, and the cathode 25 (an upper electrode). The reflective liquid crystal element LD includes the pixel electrode 28, the liquid crystal layer 30, and the counter electrode Ce. The light-emitting element ED is covered with the sealing film 26 having an island shape.

The material of the base material 10 include glass and polyethylene terephthalate (PET). The barrier layer 13 is a layer that prevents foreign matter such as moisture or oxygen from reaching the transistors TRy, TRz, the light-emitting layer 24, or the like and can be configured by a silicon oxide film, a silicon nitride film, a silicon oxynitride film, or by a layered film of these, formed by chemical vapor deposition (CVD), for example.

The semiconductor films 15a, 15b are formed of low-temperature polysilicon (LTPS) or an oxide semiconductor, for example. The semiconductor film 15a includes a channel portion Ca, a source portion Sa, and a drain portion Da, and the semiconductor film 15b includes a channel portion Cb, a source portion Sb, and a drain portion Db.

The inorganic insulating films 16, 18 can be configured by a silicon oxide (SiOx) film, a silicon nitride (SiNx) film, or a layered film of these, formed by CVD.

The electrodes Ga, Gb, Ea, Eb, Ee, Ef, Eh, Ei are configured by a single layer film or a layered film of metal including at least one of aluminum (Al), tungsten (W), molybdenum (Mo), tantalum (Ta), chromium (Cr), titanium (Ti), and copper (Cu), for example.

The transistor TRy (see FIG. 1(b)) includes the semiconductor film 15a and the electrode Ga (a gate electrode) overlapping the channel portion Ca, with the inorganic insulating film 16 interposed therebetween. The transistor TRz (see FIG. 1(b)) includes the semiconductor film 15b and the electrode Gb (a gate electrode) overlapping the channel portion Cb, with the inorganic insulating film 16 interposed therebetween.

The interlayer insulating film 21 is a film covering the electrodes Ea, Eb, Ef, Eh, Ei, which are referred to as a source metal (a source layer) and can be formed of a coatable photosensitive organic material such as polyimide or acrylic, for example. The interlayer insulating film 21 functions as a foundation film (a flattening film) of the light-emitting element ED.

The drain portion Da (the drain of the transistor TRy) of the semiconductor film 15a is connected to the electrode Ec that fills in a contact hole Ha of the interlayer insulating film 21 with the electrode Eb interposed therebetween, and the electrode Ec is connected to the pixel electrode 28 in the contact hole Hb of the buffer film Bf. Note that the capacitance Cs (see FIG. 1(b)) is formed at a portion where the drain portion Da and the electrode Ee overlap each other with the inorganic insulating film 16 interposed between the drain portion Da and the electrode Ee. The source portion Sb of the semiconductor film 15b (the source of the transistor TRz) is connected to the anode 22 that fills in a contact hole of the interlayer insulating film 21 with the electrode Eh interposed therebetween.

The anode 22, the light reflective film Rf, and the electrode Ec are a light reflective layered film in which an Ag alloy film is sandwiched between two Indium Tin Oxide (ITO) films, for example, and can be formed on the interlayer insulating film 21 in the same step (in the same layer).

The electrode cover film 23 and the buffer film Bf are an organic insulating film formed in the same layer (in the same step) and formed by applying a photosensitive organic material such as a polyimide or an acrylic and then by patterning the photosensitive organic material by photolithography, for example.

The light-emitting layer 24 is formed into an island shape for each subpixel by vapor deposition using a Fine Metal Mask (FMM) or an ink-jet method. Although omitted in the drawings, a hole transport layer may be provided between the anode 22 and the light-emitting layer 24.

The cathode 25 is a transparent MgAg alloy film having a thickness of 20 nm or less, for example, and is formed in an island shape for each subpixel. Although omitted in the drawings, an electron transport layer may be provided between the light-emitting layer 24 and the cathode 25. The cathode 25 can be patterned and formed by vapor deposition using the FMM, for example.

In the light-emitting element ED (OLED), positive holes and electrons recombine inside the light-emitting layer 24 in response to a drive current between the anode 22 and the cathode 25, and light is emitted as a result of excitons, which are generated by the recombination, falling into a ground state. Since the cathode 25 is transparent and the anode 22 is light-reflective, the light emitted from the light-emitting layer 24 travels upwards, which results in top emission (upward light emission).

The sealing film 26 is a layered film including two inorganic sealing films and is formed in an island shape such that the light-emitting element ED is covered with the sealing film 26 for each subpixel. The inorganic sealing film can be configured by a silicon oxide film, a silicon nitride film, a silicon oxynitride film, or a layered film thereof, formed by CVD, for example. A coatable organic film such as acrylic can be disposed between the two inorganic sealing films. In a case that foreign matter is present inside or on the first inorganic sealing film (a lower film), separate portions of the second inorganic sealing film (an upper film) are formed at a stepped portion caused by the foreign matter, which results in deterioration of sealing performance; however, the coatable organic film can prevent the sealing performance from deteriorating.

The pixel electrode 28 covering the buffer film Bf and the sealing film 26 is formed for each subpixel using a transparent conductive material such as ITO or IZO. The alignment film Fx covering the pixel electrode 28 can be formed using polyimide or the like; however, the alignment treatment (pretilt addition) in which rubbing or UV irradiation is performed is not performed in consideration of the effect on the light-emitting element ED.

The liquid crystal layer 30 is a vertical alignment (VA) mode liquid crystal layer which is of a normally black type, and the alignment film Fy of the second substrate 2 is subjected to an alignment treatment (pretilt addition). The color (red, green, and blue) of the color filter CF is defined for each subpixel. The counter electrode Ce is a common electrode supplied with a common electrical potential Vcom and is formed using a transparent conductive material such as ITO or IZO.

The circular polarizer 40 is formed by a combination of a linear polarizer and a ¼ wavelength phase difference plate, for example. The circular polarizer is set such that in a case that the liquid crystal layer 30 is in a vertical alignment state (in a case that a voltage across the LD is minimum), a phase of light passing through the liquid crystal layer is not shifted, for example, and this causes the minimum transmission of external light passing through the circular polarizer 40 and the liquid crystal layer 30, reflected from the light reflective film Rf, and returned to the circular polarizer 40 again (black display). Meanwhile, the circular polarizer is set such that in a case that the liquid crystal layer 30 is in a horizontal alignment state (in a case that a voltage across the LD is maximum), a phase of light passing through the liquid crystal layer is shifted by a ¼ wavelength, and this causes the maximum transmission of external light passing through the circular polarizer 40 and the liquid crystal layer 30, reflected from the light reflective film Rf, and returned to the circular polarizer 40 again (white display).

Figure 3:
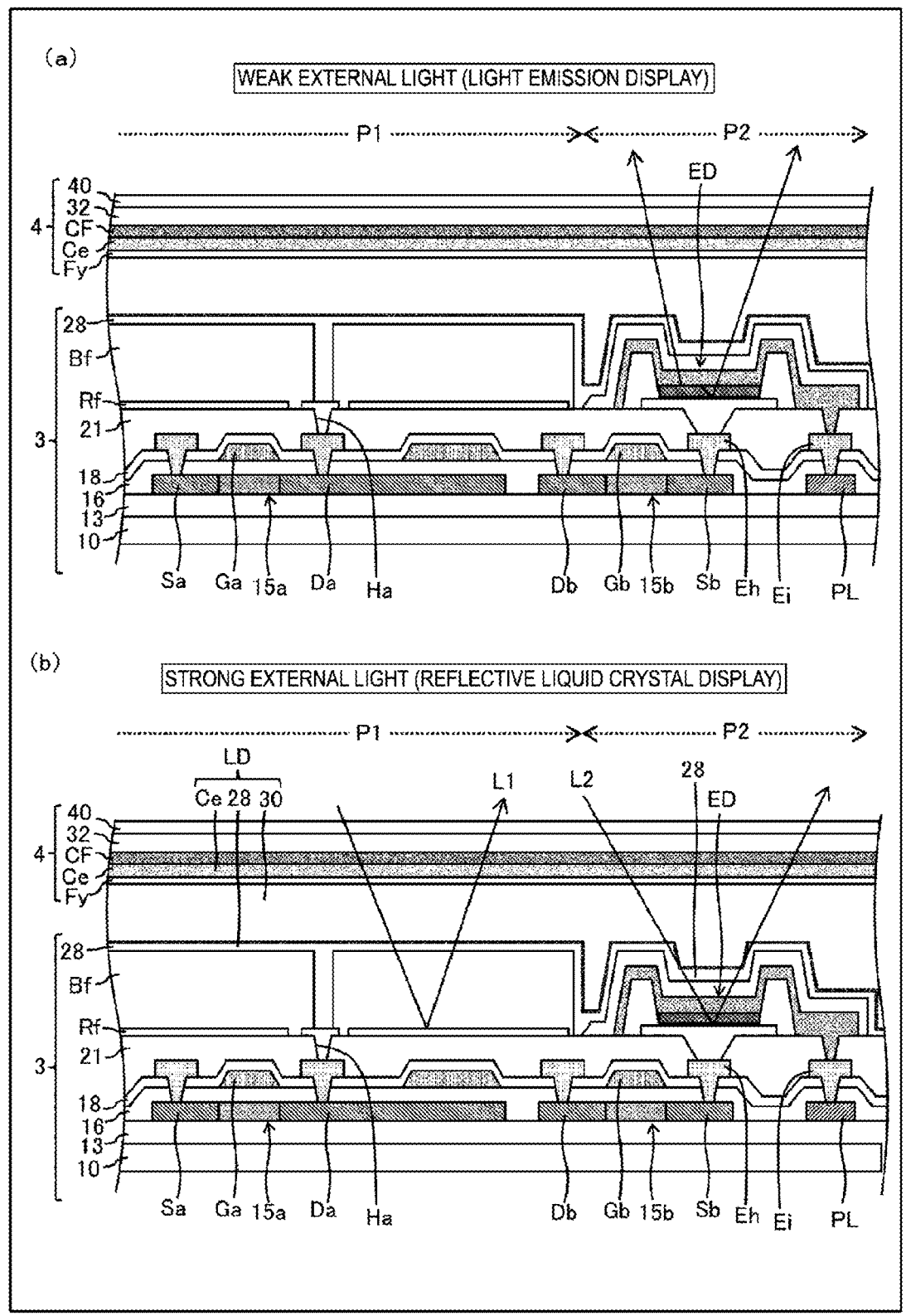
FIG. 3 is a cross-sectional view illustrating a display principle of a display device according to the first embodiment.

FIG. 3 is a cross-sectional view illustrating a display principle of a display device according to the first embodiment. In a case that the amount of external light obtained by the external light sensor LS is less than a threshold, the display control circuit DCC illustrated in FIG. 1 sets the subpixel to a first mode in which the light emission display is performed by the light-emitting element ED as illustrated in FIG. 3(a). In a case that the amount of external light is equal to or greater than the threshold, the display control circuit DCC sets the subpixel to a second mode in which the light-emitting element ED does not emit light and the reflective liquid crystal display is performed by the reflective liquid crystal element LD as illustrated in FIG. 3(b). This can prevent the light emission display from deteriorating under strong external light and achieve low power consumption.

As illustrated in FIGS. 2 and 3, in the first substrate 1, the pixel electrode 28 is provided in an upper layer than the sealing film 26 having an island shape and covering the light-emitting element ED, and the pixel electrode 28 includes a first portion P1 that does not overlap the sealing film 26 and a second portion P2 that overlaps the sealing film 26. The light reflective film Rf overlapping the pixel electrode 28 is provided in the lower layer than the pixel electrode 28. More specifically, the anode 22 of the light-emitting element ED includes an edge portion 22e covered with the electrode cover film 23 and a non-edge portion 22k (an exposed portion under an opening 23k of the electrode cover film 23) that is not covered with the electrode cover film 23, and the entirety of the non-edge portion 22k overlaps the light-emitting layer 24, the cathode 25, the sealing film 26, and the second portion P2 of the pixel electrode 28.

In this way, the first portion P1 and the second portion P2 of the pixel electrode 28 can be used for the reflective liquid crystal element LD, and in FIG. 3(b), external light L1 that is reflected from the light reflective film Rf and passes through the first portion P1, and external light L2 that is reflected from the anode 22 and passes through the second portion P2 can contribute to the display. As a result, the luminance when performing the reflective liquid crystal display can be increased. Note that the light reflective film Rf is formed and does not overlap the cathode 25 of the light-emitting element ED.

The first substrate 1 of the first embodiment includes the electrode cover film 23 covering the anode 22 of the light-emitting element ED and the buffer film Bf in the same layer (formed in the same process) as that of the electrode cover film 23, the buffer film Bf overlaps the first portion P1, the electrode cover film 23 overlaps the second portion P2, and the buffer film Bf is thicker than the electrode cover film 23. The first portion P1 of the pixel electrode 28 is formed on the buffer film Bf, the second portion P2 is formed on the sealing film 26, and the thickness of the liquid crystal layer 30 overlapping the first portion P1 is the same as the thickness of the liquid crystal layer 30 overlapping the second portion P2. This allows the thickness (cell gap) of the liquid crystal layer 30 to be a value suitable for the reflective liquid crystal display (from 1.5 to 2.5 µm) and the quality of the reflective liquid crystal display to be increased without deteriorating the quality of the light emission display.

Figure 4:
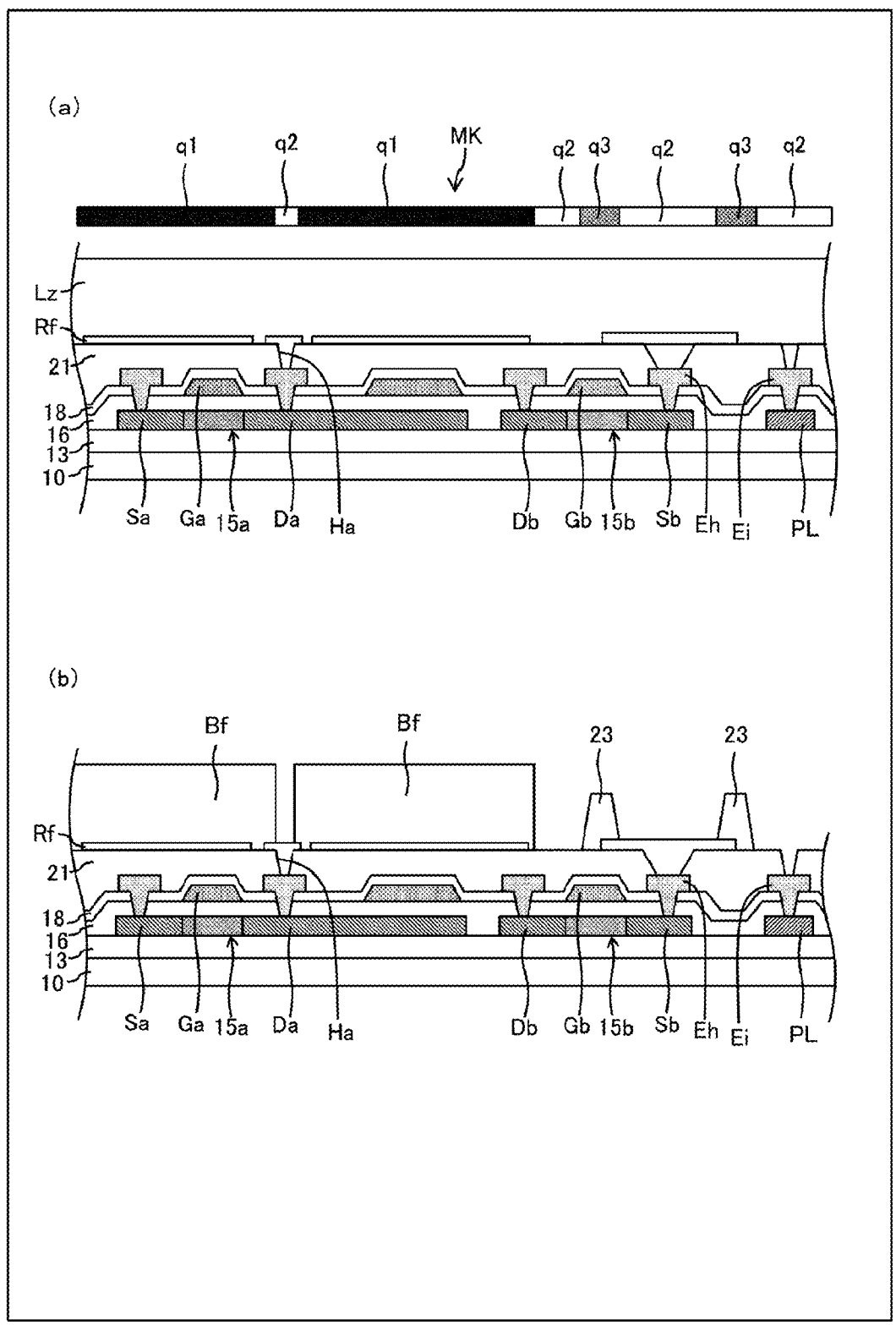
FIG. 4 is a cross-sectional view illustrating a method for manufacturing a display device according to the first embodiment.

FIG. 4 is a cross-sectional view illustrating the manufacturing method of the display device according to the first embodiment. As illustrated in FIG. 4(a), a positive-type resist material Lz (for example, polyimide), which is a material of the electrode cover film 23 and the buffer film Bf, is exposed through a mask MK including a light blocking portion q1, a transparent portion q2, and a halftone portion (a limited transparent portion) q3 and then developed. In a case where the light blocking portion q1 is positioned corresponding to a formation position of the buffer film Bf, and the halftone portion q3 is positioned corresponding to a formation position of the electrode cover film 23, the buffer film Bf can be formed thicker than the electrode cover film 23, as illustrated in FIG. 4(b). Since the thickness of the sealing film 26 and the like should be taken into consideration, the buffer film BF is formed thicker than the electrode cover film 23. This allows the electrode cover film 23 and the buffer film Bf to be formed using a single mask MK at one exposure.

Figure 5:
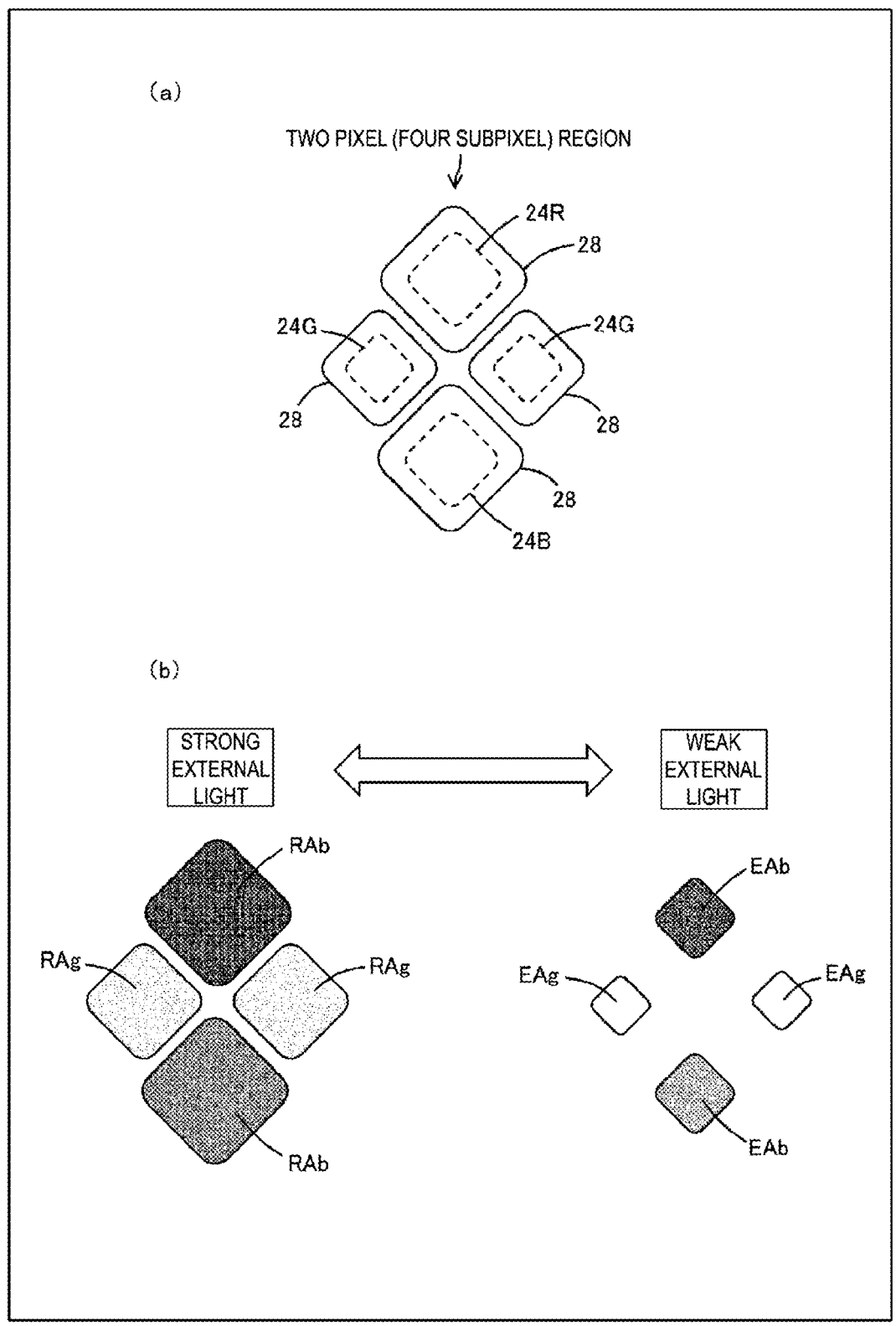
FIG. 5(a) is a plan view illustrating two pixel regions of a display device according to the first embodiment.
FIG. 5(b) is a plan view illustrating a display example of the two pixel regions (in a case of strong external light and in a case of weak external light).

FIG. 5(a) is a plan view illustrating two pixel regions of a display device according to the first embodiment, and FIG. 5(b) is a plan view illustrating a display example of the two pixel regions (in a case of strong external light and in a case of weak external light). As illustrated in FIGS. 2 and 5, in a plan view, the non-edge portion 22k of the anode 22 is positioned inside the outer periphery of the pixel electrode 28, and the first portion P1 of the pixel electrode 28 (a portion that does not overlap the sealing film 26) surrounds the second portion P2 (a portion that overlaps the sealing film 26). That is, in a plan view, a light-emitting region EA of the light-emitting element ED is positioned inside the outer periphery of the pixel electrode 28, and the center of the pixel electrode 28 coincides with the center of the light-emitting region EA. A light-emitting region RAr of the red subpixel, a light-emitting region RAg of the green subpixel, and a light-emitting region RAb of the blue subpixel, in a case of strong external light, can be made larger than, respectively, a light-emitting region EAr of the red subpixel, a light-emitting region EAg of the green subpixel, and a light-emitting region EAb of the blue subpixel in a case of weak external light. Thus, the quality of the reflective liquid crystal display can be increased. Furthermore, even in a case where the light emission display and the reflective liquid crystal display are switched, the luminance center of the subpixel does not change. This reduces a feeling of strangeness when display is switched. In FIG. 1, 5, or the like, red, green, and blue subpixels are disposed in a pentile manner, but this is merely an example.

In the first embodiment, the first portion P1 of the pixel electrode 28 (a portion that does not overlap the sealing film 26) formed in an upper layer than the sealing film 26 is connected to the transistor TRy with the contact hole Ha of the interlayer insulating film 21 and the contact hole Hb of the buffer film Bf interposed therebetween. Since the pixel electrode 28 and the transistor TRy are electrically connected without forming holes in the sealing film 26, the sealing effect can be increased, and the deterioration of the light-emitting element ED can be suppressed.

Second Embodiment

Figure 6:
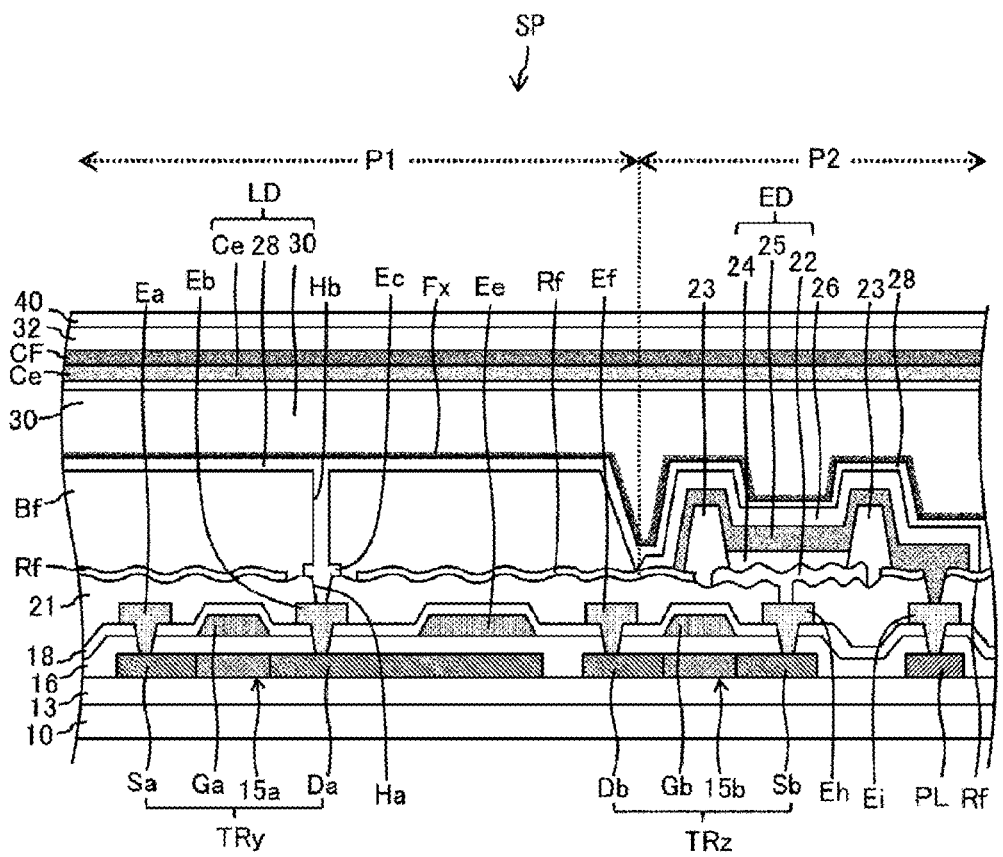
FIG. 6 is a cross-sectional view illustrating a display device according to a second embodiment.

FIG. 6 is a cross-sectional view illustrating a display device according to the second embodiment. In the second embodiment, the light reflective film Rf including a recessed and protruded surface overlaps the light-emitting element ED, and recesses and protrusions are also formed on a surface of the anode 22 in the same layer (formed in the same step) as that of the light reflective film Rf. This allows reflected light to be efficiently diffused in each of a region overlapping the first portion P1 of the pixel electrode 28 and a region overlapping the second portion P2 of the pixel electrode 28, and thus the quality of the reflective liquid crystal display can be increased. In addition, since the edge of the sealing film 26 is in contact with the light reflective film Rf, which is an inorganic film and bonding properties between the two films are excellent, great sealing effect is achieved.

In a configuration illustrated in FIG. 6, the light reflective film Rf and the cathode 25 are in contact with each other, and the cathode electrical potential is supplied to the light reflective film Rf. A configuration is also possible in which the light reflective film Rf and the cathode 25 are not in contact with each other.

Third Embodiment

Figure 7:
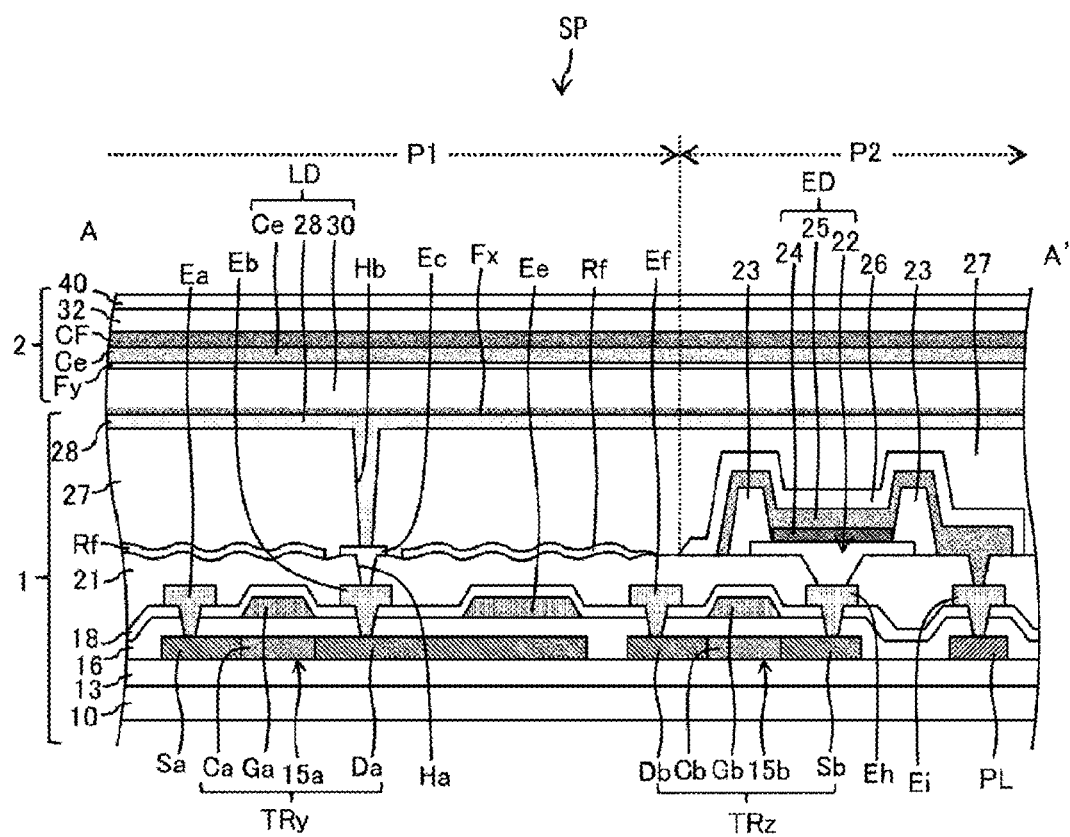
FIG. 7 is a cross-sectional view illustrating a display device according to a third embodiment.

FIG. 7 is a cross-sectional view illustrating a display device according to the third embodiment. In the third embodiment, a flattening film 27 is provided in an upper layer than the sealing film 26 and in a lower layer than the pixel electrode 28 and overlaps the first portion P1 and the second portion P2 of the pixel electrode 28.

In FIG. 7, the flattening film 27 is formed covering the light reflective film Rf and the sealing film 26, and the pixel electrode 28 is formed on the flattening film 27. The flattening film 27 can be formed of a coatable photosensitive organic material such as polyimide or acrylic, for example.

According to the third embodiment, the thickness of the liquid crystal layer 30 overlapping the first portion P1 and the thickness of the liquid crystal layer 30 overlapping the second portion P2 can be an optimal value for the reflective liquid crystal display (from 1.5 to 2.5 µm), and the quality of the reflective liquid crystal display can be increased without deteriorating the quality of the light emission display.

Supplement

An electro-optical element (an electro-optical element whose luminance and transmittance are controlled by an electric current) that is provided in a display device according to the present embodiment is not particularly limited thereto. Examples of the display device according to the present embodiment include an organic Electro Luminescence (EL) display provided with the Organic Light Emitting Diode (OLED) as the electro-optical element, an inorganic EL display provided with an inorganic light emitting diode as the electro-optical element, and a Quantum dot Light Emitting Diode (QLED) display provided with a QLED as the electro-optical element.

First Aspect

A display device includes a first substrate including a light-emitting element that is an upward light emission type and a transistor in a lower layer than the light-emitting element, a second substrate facing the first substrate, and a liquid crystal layer disposed between the first substrate and the second substrate. The first substrate includes a sealing film formed in an island shape and covering the light-emitting element and a pixel electrode that is transparent, and the pixel electrode includes a first portion not overlapping the sealing film and a second portion overlapping the sealing film.

Second Aspect

The display device described in aspect 1, for example, wherein a light reflective film overlapping the pixel electrode is provided.

Third Aspect

The display device described in aspect 2, for example, further including an electrode cover film covering a lower electrode of the light-emitting element and a buffer film in a layer identical to a layer of the electrode cover film, wherein the electrode cover film overlaps the second portion, and the buffer film overlaps the first portion, and the buffer film is thicker than the electrode cover film.

Fourth Aspect

The display device described in aspect 2, for example, wherein the first portion is formed on the buffer film, and the second portion is formed on the sealing film.

Fifth Aspect

The display device described in aspect 2, for example, further including a flattening film provided in an upper layer than the sealing film and in a lower layer than the pixel electrode, wherein the flattening film overlaps the first portion and the second portion of the pixel electrode.

Sixth Aspect

The display device described in aspect 4 or 5, for example, wherein a thickness of the liquid crystal layer overlapping the first portion is identical to a thickness of the liquid crystal layer overlapping the second portion.

Seventh Aspect

The display device described in any one of aspects 1 to 6, for example, wherein an interlayer insulating film is provided in an upper layer than the transistor and in a lower layer than the light-emitting element, and the light reflective film is formed on the interlayer insulating film.

Eighth Aspect

The display device described in any one of aspects 1 to 7, for example, wherein the pixel electrode is provided in an upper layer than the sealing film, and a first portion of the pixel electrode and the transistor are connected with a contact hole interposed between the first portion and the transistor.

Ninth Aspect

The display device described in aspect 2, for example, wherein the light reflective film includes a recessed and protruded surface.

Tenth Aspect

The display device described in any one of aspects 1 to 9, for example, wherein a light-emitting region of the light-emitting element is located inside an outer periphery of the pixel electrode in a plan view.

Eleventh Aspect

The display device described in aspect 10, for example, wherein a center of the pixel electrode coincides with a center of the light-emitting region of the light-emitting element.

Twelfth Aspect

The display device described in any one of aspects 1 to 11, for example, wherein the first substrate includes a lower alignment film in contact with the liquid crystal layer, and the second substrate includes an upper alignment film in contact with the liquid crystal layer, and the upper alignment film is subjected to pretilt, and the lower alignment film is not subjected to the pretilt.

Thirteenth Aspect

The display device described in any one of aspects 1 to 12, for example, wherein the sealing film and the pixel electrode are provided for each subpixel.

Fourteenth Aspect

The display device described in aspect 13, for example, wherein a reflective liquid crystal element including the pixel electrode and the liquid crystal layer; and the light-emitting element covered with the sealing film are provided for each subpixel, and a first mode in which light emission display is performed by the light-emitting element and a second mode in which the light-emitting element does not emit light and reflective liquid crystal display is performed by the reflective liquid crystal element are switched depending on an amount of external light.

REFERENCE SIGNS LIST

1 First substrate
2 Second substrate
3 Display device
10 Base material
13 Barrier layer
16, 18 Inorganic insulating film
21 Interlayer insulating film
22 Anode (lower electrode)
23 Electrode cover film
24 Light-emitting layer
25 Cathode (upper electrode)
26 Sealing film
27 Flattening film
28 Pixel electrode
30 Liquid crystal layer
40 Circular polarizer
ED Light-emitting element
LD Reflective liquid crystal element
Rf Light reflective film
Bf Buffer film
Fx, Fy Alignment film
Ce Counter electrode
CF Color filter
Ha, Hb Contact hole
TRx to TRz Transistor

The invention claimed is:

1. A display device comprising:
a first substrate including a light-emitting element that is an upward light emission type and a transistor in a lower layer than the light-emitting element;
a second substrate opposing the first substrate; and
a liquid crystal layer disposed between the first substrate and the second substrate, wherein
the first substrate includes a sealing film defined in an island shape and covering the light-emitting element, and a pixel electrode that is transparent,
the pixel electrode includes a first portion not overlapping the sealing film and a second portion overlapping the sealing film, and
a contact hole connecting the transistor and the pixel electrode is defined to overlap the first portion and does not pass through the sealing film.

2. The display device according to claim 1, wherein a light reflective film overlapping the pixel electrode is provided.

3. The display device according to claim 1 further comprising:
an electrode cover film covering a lower electrode of the light-emitting element; and
a buffer film in a layer identical to a layer of the electrode cover film, wherein
the electrode cover film overlaps the second portion, and the buffer film overlaps the first portion, and
the buffer film is thicker than the electrode cover film.

4. The display device according to claim 3, wherein
the first portion is formed on the buffer film, and
the second portion is formed on the sealing film.

5. The display device according to claim 1 further comprising:
a flattening film provided in an upper layer than the sealing film and in a lower layer than the pixel electrode,
wherein the flattening film overlaps the first portion and the second portion of the pixel electrode.

6. The display device according to claim 4, wherein a thickness of the liquid crystal layer overlapping the first portion is identical to a thickness of the liquid crystal layer overlapping the second portion.

7. The display device according to claim 2, wherein
an interlayer insulating film is provided in an upper layer than the transistor and in a lower layer than the light-emitting element, and
the light reflective film is formed on the interlayer insulating film.

8. The display device according to claim 2, wherein the light reflective film includes a recessed and protruded surface.

9. The display device according to claim 1, wherein, a light-emitting region of the light-emitting element is located inside an outer periphery of the pixel electrode in a plan view.

10. The display device according to claim 9, wherein a center of the pixel electrode coincides with a center of the light-emitting region of the light-emitting element.

11. The display device according to claim 1, wherein
the first substrate includes a lower alignment film in contact with the liquid crystal layer, and the second substrate includes an upper alignment film in contact with the liquid crystal layer, and the upper alignment film is subjected to pretilt, and the lower alignment film is not subjected to the pretilt.

12. The display device according to claim 1, wherein the sealing film and the pixel electrode are provided for each subpixel.

13. The display device according to claim 12, wherein a reflective liquid crystal element including the pixel electrode and the liquid crystal layer; and the light-emitting element covered with the sealing film are provided for each subpixel, and a first mode in which light emission display is performed by the light-emitting element and a second mode in which the light-emitting element does not emit light and reflective liquid crystal display is performed by the reflective liquid crystal element are switched depending on an amount of external light.

14. A display device comprising:
a first substrate including a light-emitting element that is an upward light emission type and a transistor in a lower layer than the light-emitting element;
a second substrate opposing the first substrate;
a liquid crystal layer between the first substrate and the second substrate;
an electrode cover film covering a lower electrode of the light-emitting element; and
a buffer film in a layer identical to a layer of the electrode cover film, wherein
the buffer film is thicker than the electrode cover film,
the first substrate includes a sealing film defined in an island shape and covering the light-emitting element, and a pixel electrode that is transparent,
the pixel electrode includes a first portion not overlapping the sealing film and a second portion overlapping the sealing film,
the electrode cover film overlaps the second portion, and
the buffer film overlaps the first portion.

15. The display device according to claim 14, wherein a light reflective film overlapping the pixel electrode is provided.

16. The display device according to claim 14, wherein the first portion is formed on the buffer film, and the second portion is formed on the sealing film.

17. The display device according to claim 14, wherein the pixel electrode is provided in an upper layer than the sealing film, and
the first portion of the pixel electrode and the transistor are connected with a contact hole between the first portion and the transistor.

18. A display device comprising:
a first substrate including a light-emitting element that is an upward light emission type and a transistor in a lower layer than the light-emitting element;
a second substrate opposing the first substrate; and
a liquid crystal layer between the first substrate and the second substrate, wherein
the first substrate includes a sealing film defined in an island shape and covering the light-emitting element, and a pixel electrode that is transparent,
the pixel electrode includes a first portion not overlapping the sealing film and a second portion overlapping the sealing film,
a light-emitting region of the light-emitting element is located inside an outer periphery of the pixel electrode in a plan view, and
a center of the pixel electrode coincides with a center of the light-emitting region of the light-emitting element.

19. The display device according to claim 18, further comprising:
a flattening film provided in an upper layer than the sealing film and in a lower layer than the pixel electrode,
wherein the flattening film overlaps the first portion and the second portion of the pixel electrode.

20. The display device according to claim 18, wherein the pixel electrode is provided in an upper layer than the sealing film, and
the first portion of the pixel electrode and the transistor are connected with a contact hole between the first portion and the transistor.

* * * * *